US006645797B1

(12) United States Patent
Buynoski et al.

(10) Patent No.: US 6,645,797 B1
(45) Date of Patent: Nov. 11, 2003

(54) METHOD FOR FORMING FINS IN A FINFET DEVICE USING SACRIFICIAL CARBON LAYER

(75) Inventors: Matthew S. Buynoski, Palo Alto, CA (US); Srikanteswara Dakshina-Murthy, Austin, TX (US); Cyrus E. Tabery, Sunnyvale, CA (US); Haihong Wang, Fremont, CA (US); Chih-Yuh Yang, San Jose, CA (US); Bin Yu, Cupertino, CA (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 0 days.

(21) Appl. No.: 10/310,926

(22) Filed: Dec. 6, 2002

(51) Int. Cl.[7] .............................................. H01L 21/84
(52) U.S. Cl. ........................ 438/157; 438/283; 438/481
(58) Field of Search ................................. 438/151, 157, 438/279, 283, 481

(56) References Cited

U.S. PATENT DOCUMENTS

| 6,316,296 | B1 | * | 11/2001 | Sakamoto | .................... | 438/157 |
| 6,413,802 | B1 | * | 7/2002 | Hu et al. | ..................... | 438/283 |
| 6,432,829 | B2 | * | 8/2002 | Muller et al. | ................ | 438/694 |
| 6,525,403 | B2 | * | 2/2003 | Inaba et al. | .................. | 257/618 |

OTHER PUBLICATIONS

Digh Hisamoto et al., "FinFET-A Self-Aligned Double-Gate MOSFET Scalable to 20 nm," IEEE Transactions on Electron Devices, vol. 47, No. 12, Dec. 2000, pp. 2320–2325.

Yang–Kyu Choi et al., "Sub–20nm CMOS FinFET Technologies," 2001 IEEE IEDM, pp. 421–424.

Xuejue Huang et al., "Sub–50 nm P–Channel FinFET," IEEE Transactions on Electron Devices, vol. 48, No. 5, May 2001, pp. 880–886.

Xuejue Huang et al., "Sub 50–nm FinFET: PMOS," 1999 IEEE, IEDM, pp. 67–70.

Yang–Kyu Choi et al., "Nanoscale CMOS Spacer FinFET for the Terabit Era," IEEE Electron Device Letters, vol. 23, No. 1, Jan. 2002, pp. 25–27.

\* cited by examiner

*Primary Examiner*—Chandra Chaudhari
(74) *Attorney, Agent, or Firm*—Harrity & Snyder L.L.P.

(57) ABSTRACT

A method for forming a fin in a semiconductor device that includes a substrate, an insulating layer formed on the substrate, and a conductive layer formed on the insulating layer, includes forming a carbon layer over the conductive layer and forming a mask over the carbon layer. The method further includes etching the mask and carbon layer to form at least one structure, where the structure has a first width, reducing the width of the carbon layer in the at least one structure to a second width, depositing an oxide layer to surround the at least one structure, removing a portion of the oxide layer and the mask, removing the carbon layer to form an opening in a remaining portion of the oxide layer for each of the at least one structure, filling the at least one opening with conductive material, and removing the remaining portion of the oxide layer and a portion of the conductive layer to form the fin.

20 Claims, 11 Drawing Sheets

US 6,645,797 B1

METHOD FOR FORMING FINS IN A FINFET DEVICE USING SACRIFICIAL CARBON LAYER

FIELD OF THE INVENTION

The present invention relates generally to semiconductor manufacturing and, more particularly, to forming one or more fins in FinFET devices.

BACKGROUND OF THE INVENTION

The escalating demands for high density and performance associated with ultra large scale integration semiconductor devices require design features, such as gate lengths, below 100 nanometers (nm), high reliability and increased manufacturing throughput. The reduction of design features below 100 nm challenges the limitations of conventional methodology.

For example, when the gate length of conventional planar metal oxide semiconductor field effect transistors (MOSFETs) is scaled below 100 nm, problems associated with short channel effects, such as excessive leakage between the source and drain, become increasingly difficult to overcome. In addition, mobility degradation and a number of process issues also make it difficult to scale conventional MOSFETs to include increasingly smaller device features. New device structures are therefore being explored to improve FET performance and allow further device scaling.

Double-gate MOSFETs represent new structures that have been considered as candidates for succeeding existing planar MOSFETs. In double-gate MOSFETs, two gates may be used to control short channel effects. A FinFET is a recent double-gate structure that exhibits good short channel behavior. A FinFET includes a channel formed in a vertical fin. The FinFET structure may be fabricated using layout and process techniques similar to those used for conventional planar MOSFETs.

SUMMARY OF THE INVENTION

Implementations consistent with the principles of the invention form one or more fins in FinFET devices through the use of a sacrificial amorphous carbon deposition.

In accordance with the purpose of this invention as embodied and broadly described herein, a method for forming a fin in a FinFET is disclosed. The method includes forming a carbon layer on a silicon on insulator (SOI) wafer; forming a mask on the carbon layer; etching the mask and the carbon layer to a first width; etching the carbon layer to a second width; forming an oxide layer over the mask and carbon layer; removing a portion of the oxide layer and the mask; removing the carbon layer to create an opening in a remaining portion of the oxide layer; forming silicon in the opening; and removing the remaining portion of the oxide layer and silicon located under the remaining portion of the oxide layer to form a fin.

In another implementation consistent with the present invention, a method of manufacturing a semiconductor device that includes a substrate, an insulating layer formed on the substrate, and a conductive layer formed on the insulating layer, is provided. The method includes depositing an amorphous carbon layer over the conductive layer; forming a hard mask over the amorphous carbon layer; etching the hard mask and the amorphous carbon layer to a first width; etching the amorphous carbon layer to a second width; depositing an oxide layer to surround the hard mask and amorphous carbon layer; removing a portion of the oxide layer and the hard mask; removing the amorphous carbon layer to form an opening in a remaining portion of the oxide layer; filling the opening with conductive material; removing the remaining portion of the oxide layer and a portion of the conductive layer to form a fin structure; forming a source region and a drain region; depositing a gate material over the fin structure; and patterning and etching the gate material to form at least one gate electrode.

In yet another implementation consistent with the principles of the invention, a method for forming at least one fin in a semiconductor device that includes a substrate, an insulating layer formed on the substrate, and a conductive layer formed on the insulating layer, is provided. The method includes forming a carbon layer over the conductive layer and forming a mask over the carbon layer. The method further includes etching the mask and carbon layer to form at least one structure, where the structure has a first width, reducing the width of the carbon layer in the at least one structure to a second width, depositing an oxide layer to surround the at least one structure, removing a portion of the oxide layer and the mask, removing the carbon layer to form an opening in a remaining portion of the oxide layer for each of the at least one structure, filling the opening with conductive material, and removing the remaining portion of the oxide layer and a portion of the conductive layer to form the at least one fin.

BRIEF DESCRIPTION OF THE DRAWINGS

The accompanying drawings, which are incorporated in and constitute a part of this specification, illustrate an embodiment of the invention and, together with the description, explain the invention. In the drawings.

DETAILED DESCRIPTION

The following detailed description of implementations consistent with the present invention refers to the accompanying drawings. The same reference numbers in different drawings may identify the same or similar elements. Also, the following detailed description does not limit the invention. Instead, the scope of the invention is defined by the appended claims and their equivalents.

Implementations consistent with the principles of the invention form a fin in FinFET devices. A narrow fin may be formed through the use of a sacrificial amorphous carbon layer.

EXEMPLARY PROCESSING

Figure 1:
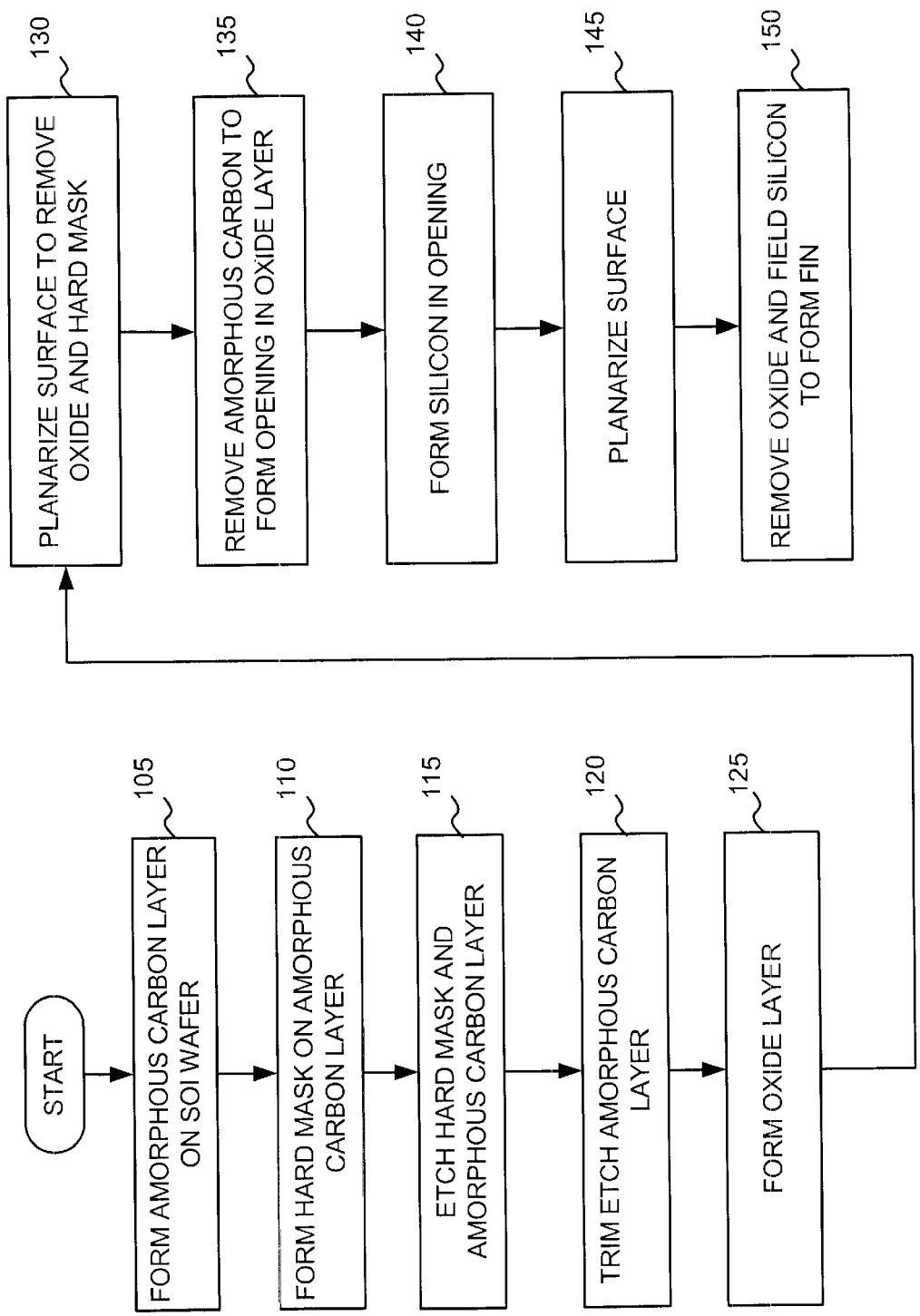
FIG. 1 illustrates an exemplary process for forming a fin in a FinFET device in an implementation consistent with the principles of the invention.

FIG. 1 illustrates an exemplary process for fabricating a FinFET in an implementation consistent with the principles of the invention. FIGS. 2–11 illustrate views of a FinFET fabricated according to the processing described in FIG. 1.

Figure 2:
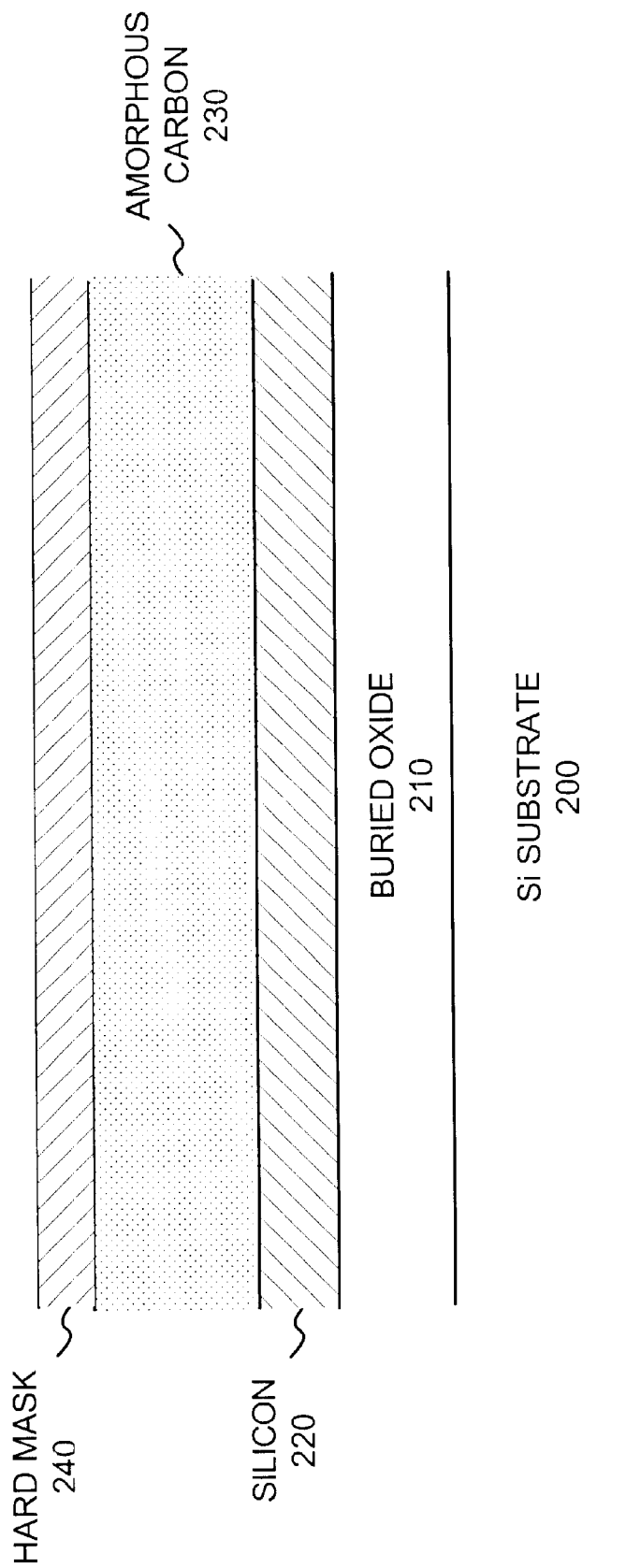
FIGS. 2–10 illustrate exemplary cross-sectional views of a FinFET device fabricated according to the processing described in FIG. 1.

With reference to FIGS. 1 and 2, processing may begin by depositing an amorphous carbon layer 230 on a silicon on insulator (SOI) structure (act 105). Amorphous carbon layer 230 may be deposited in a conventional manner. In one implementation consistent with the principles of the invention, amorphous carbon layer 230 may have a thickness ranging from about 500 Å to about 1500 Å.

The SOI structure includes a silicon substrate 200, a buried oxide layer 210, and a silicon layer 220 on buried oxide layer 210. Buried oxide layer 210 and silicon layer 220 may be formed on substrate 200 in a conventional manner. In an exemplary implementation, buried oxide layer 210 may include a silicon oxide and may have a thickness ranging from about 1500 Å to about 3000 Å. Silicon layer 220 may be monocrystalline silicon having a thickness ranging from about 100 Å to about 1000 Å.

In alternative implementations consistent with the present invention, substrate 200 and silicon layer 220 may include other materials, such as germanium, or combinations of materials, such as silicon-germanium. Buried oxide layer 210 may also include other dielectric materials.

Once the amorphous carbon layer 230 has been deposited, a hard mask 240 may be deposited on amorphous carbon layer 230, as illustrated in FIG. 2 (act 110). In one implementation, hard mask 240 may include an oxide or nitride-based material. Other materials may alternatively be used. Hard mask 240 may have a thickness ranging from about 200 Å to about 500 Å.

Figure 3:
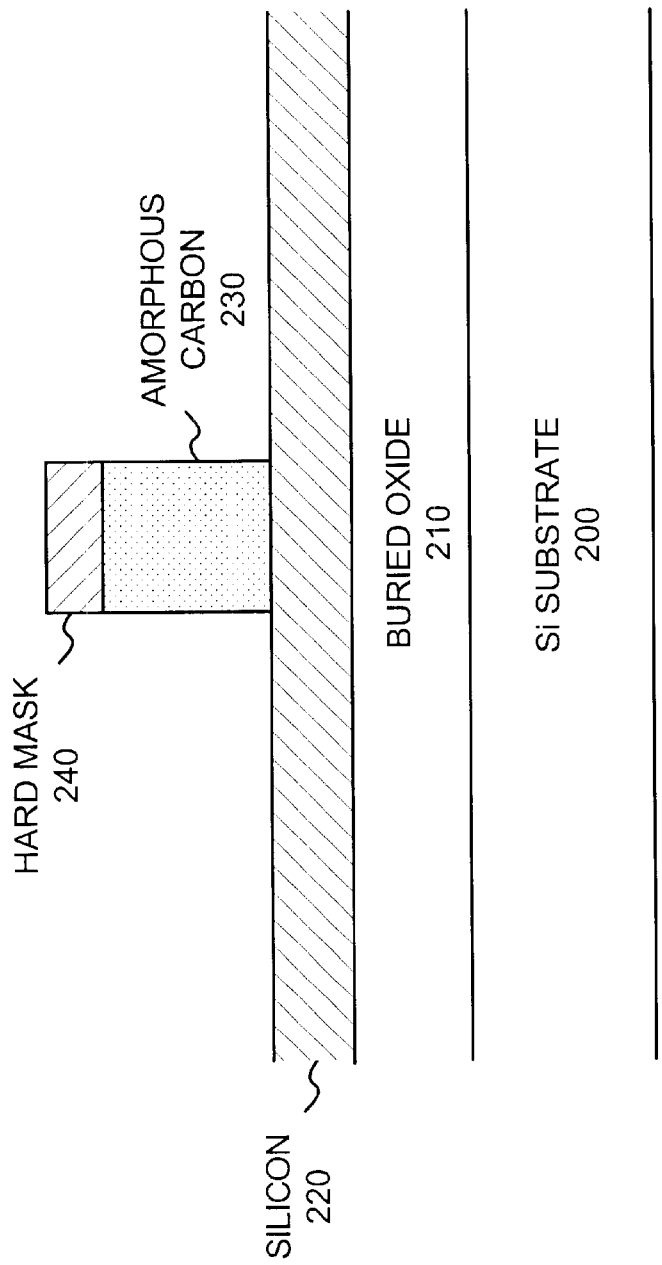

Hard mask 240 and amorphous carbon layer 230 may then be etched in a conventional manner, such as an anisotropic etch, with the etching terminating on silicon layer 220, as illustrated in FIG. 3 (act 115). In one implementation, hard mask 240 and amorphous carbon layer 230 may be etched to a width ranging from about 500 Å to about 1000 Å.

Figure 4:
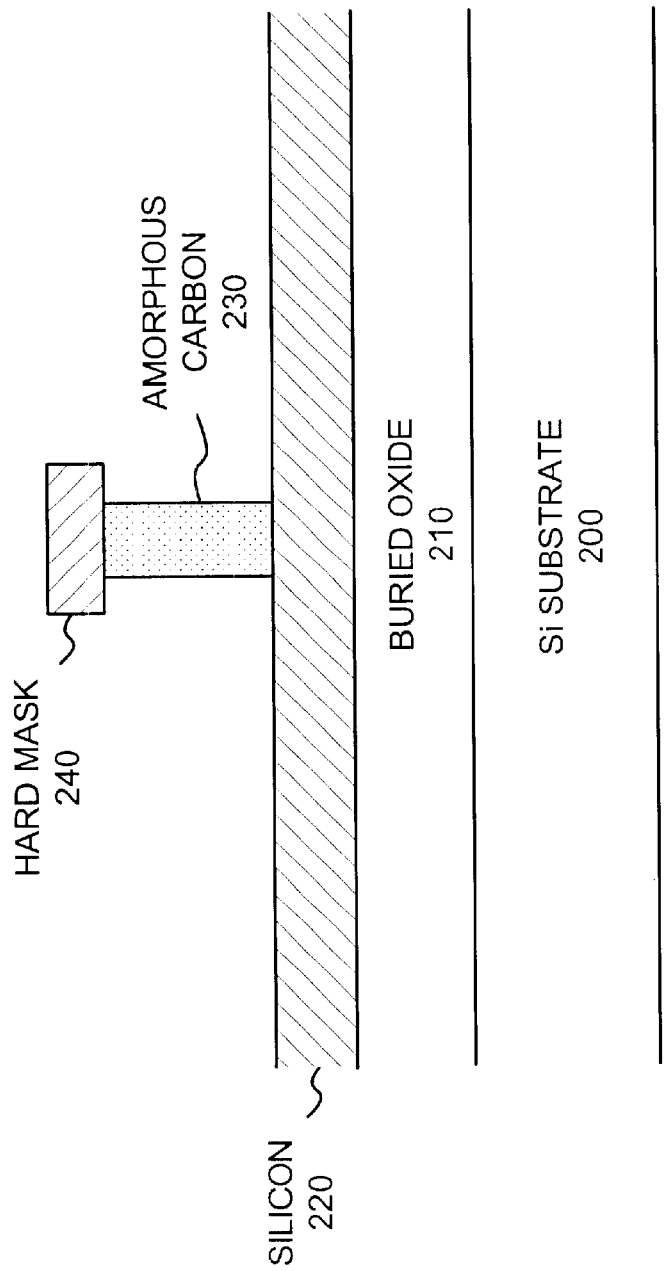
Figure 5:
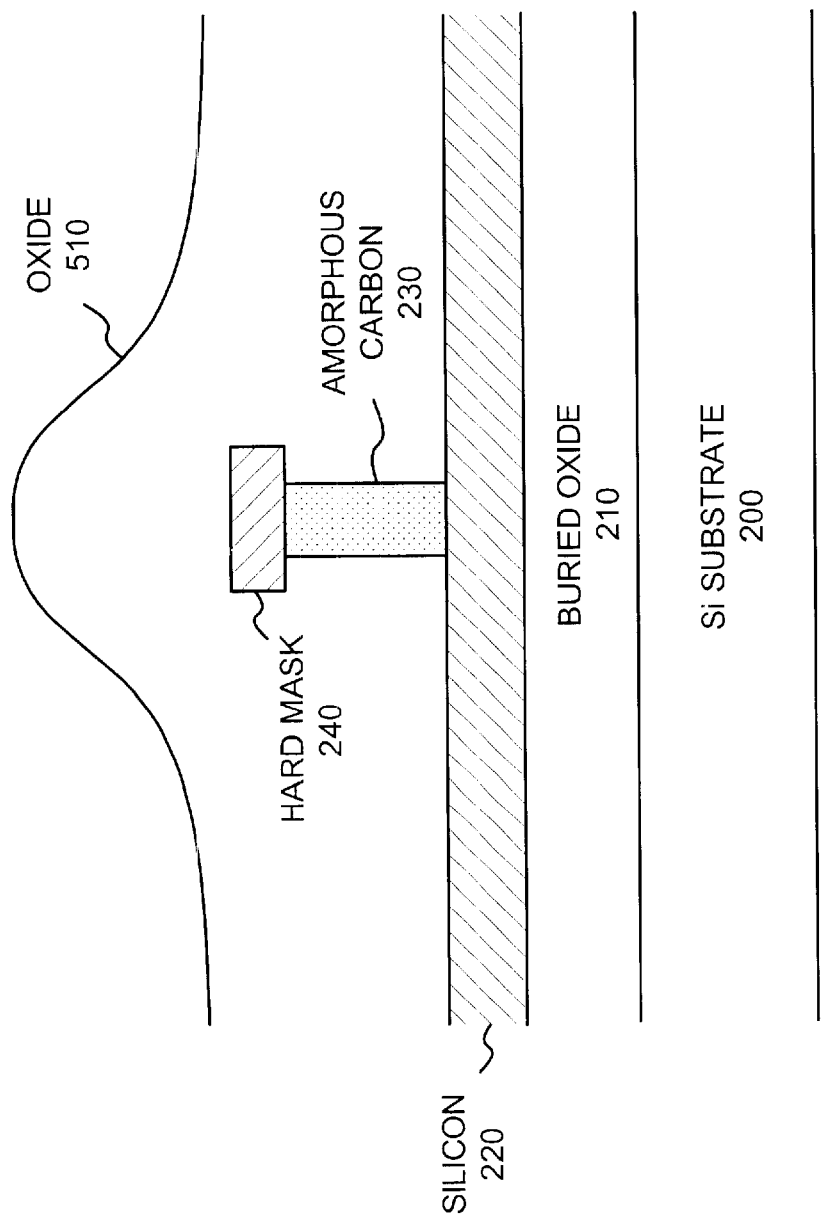

A subsequent trim etch may then be performed on amorphous carbon layer 230 to further reduce the width of amorphous carbon layer 230, as illustrated in FIG. 4 (act 120). In one implementation consistent with the principles of the invention, the resulting width of amorphous carbon layer 230 after etching may range from about 250 Å to about 450 Å. An oxide layer 510 may then be deposited to cover amorphous carbon layer 230 and hard mask 240, as illustrated in FIG. 5 (act 125). In one implementation consistent with the principles of the invention, layer 510 may consist of other films or materials that may be deposited or grown.

Figure 6:
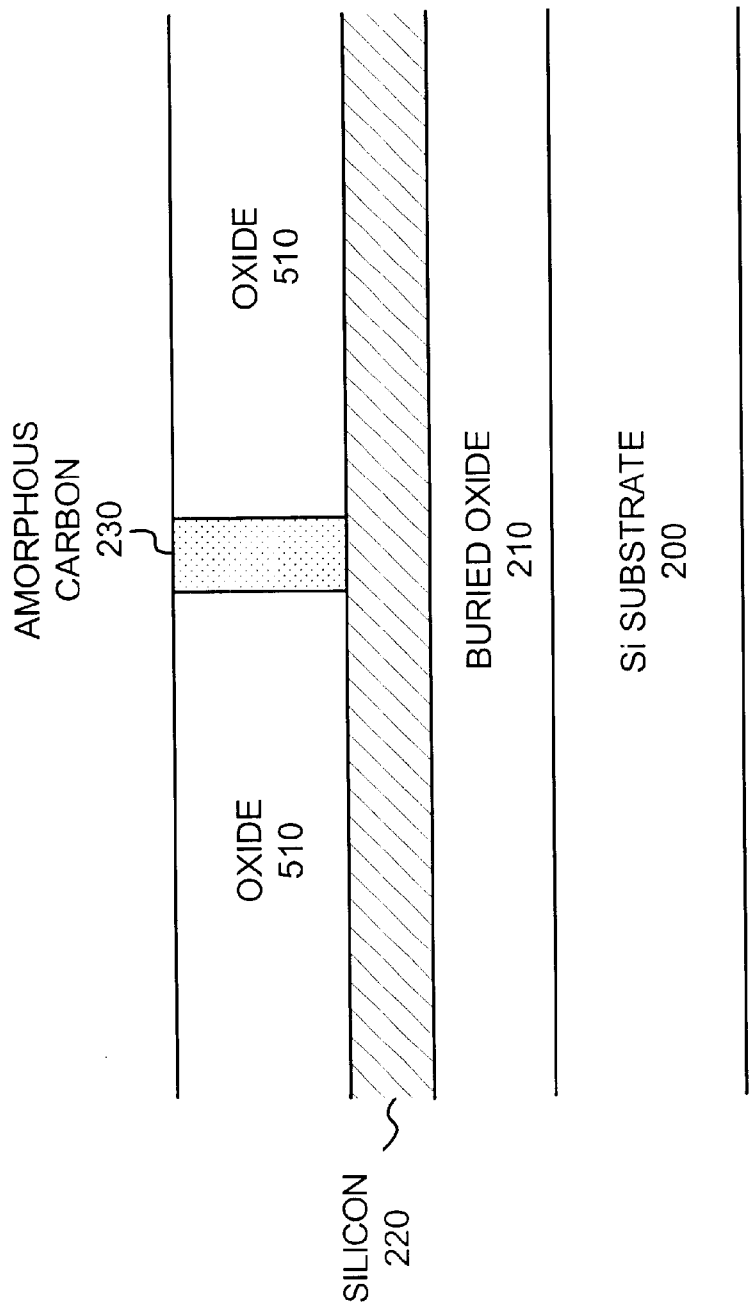
Figure 7:
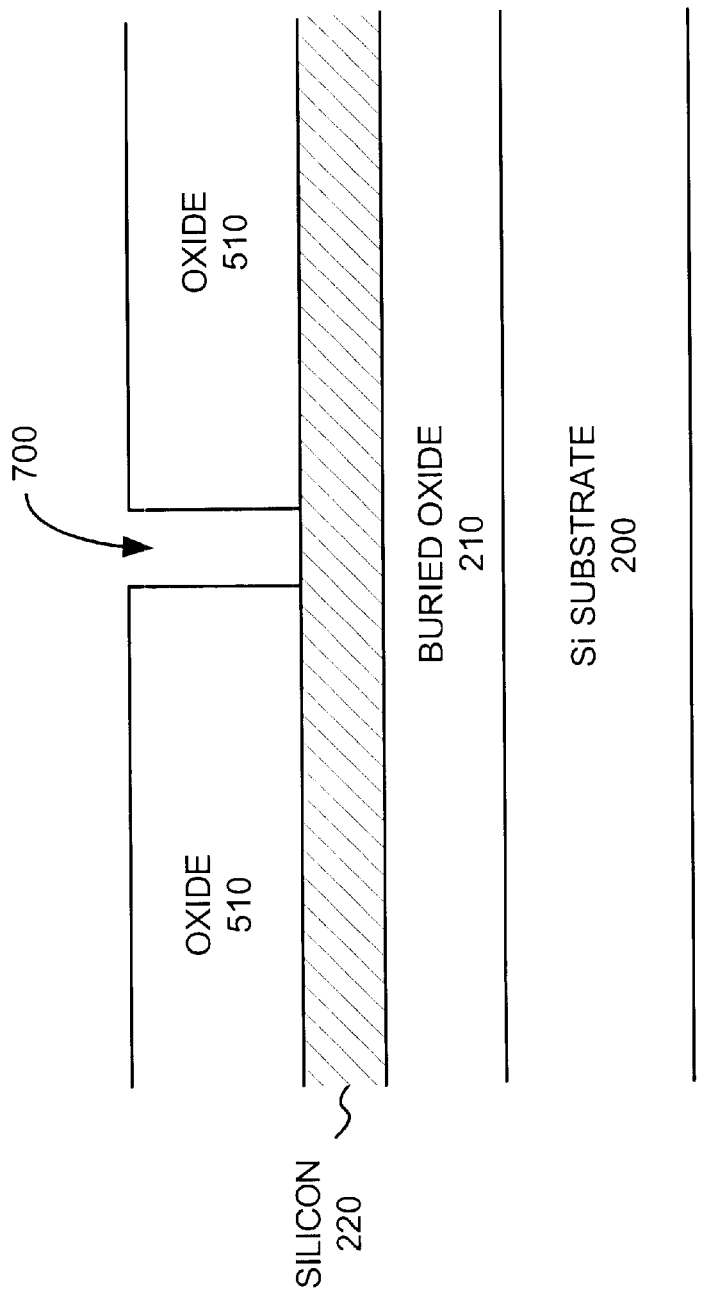

Oxide layer 510 and hard mask 240 may be planarized via a chemical-mechanical polish (CMP) or other conventional technique, with the planarizing terminating at the top surface of amorphous carbon layer 230, as illustrated in FIG. 6 (act 130). Amorphous carbon layer 230 may then be removed to create opening 700 via plasma oxidation of amorphous carbon layer 230 or another conventional technique, as illustrated in FIG. 7 (act 135). The width of opening 700 corresponds to the reduced width of amorphous carbon layer 230 obtained in act 120. It should be understood, however, that the particular width of opening 700 may vary based on the particular circuit requirements associated with the fin in the FinFET device that will be formed.

Figure 8:
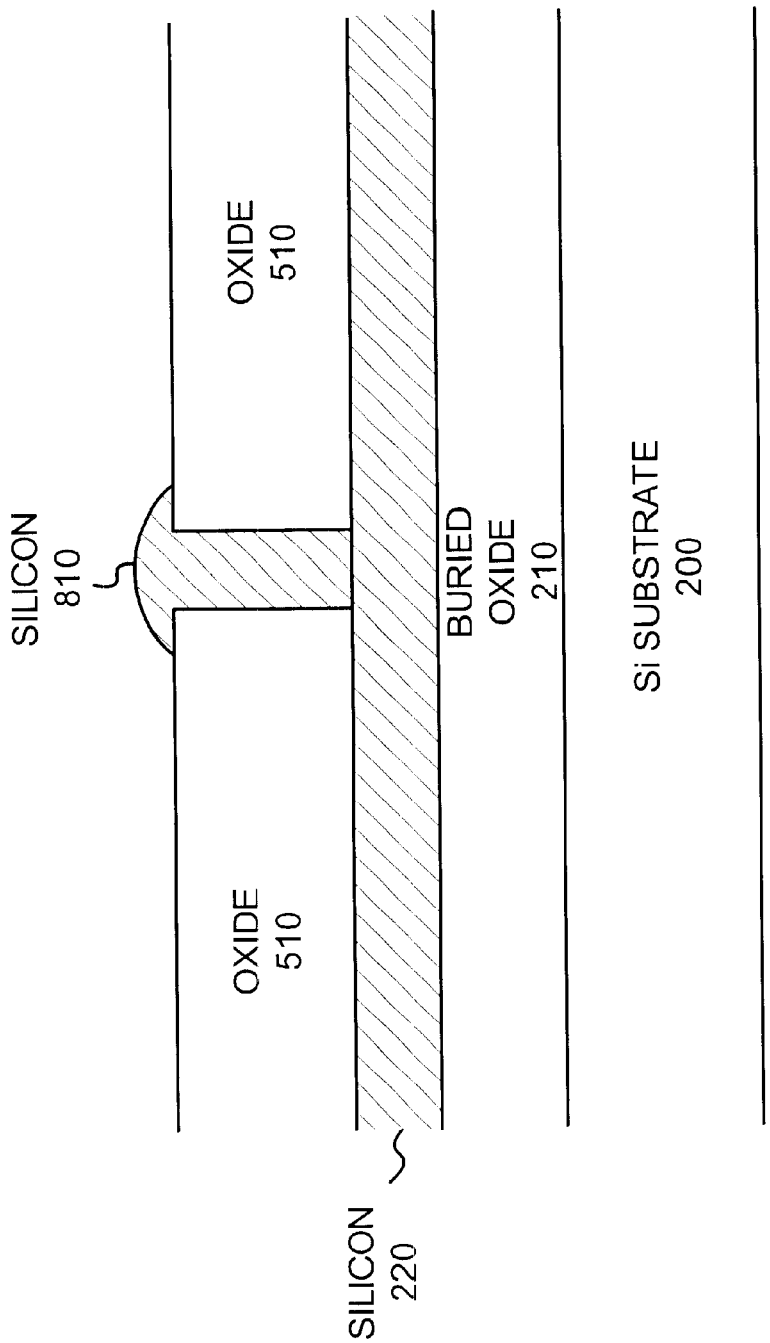
Figure 9:
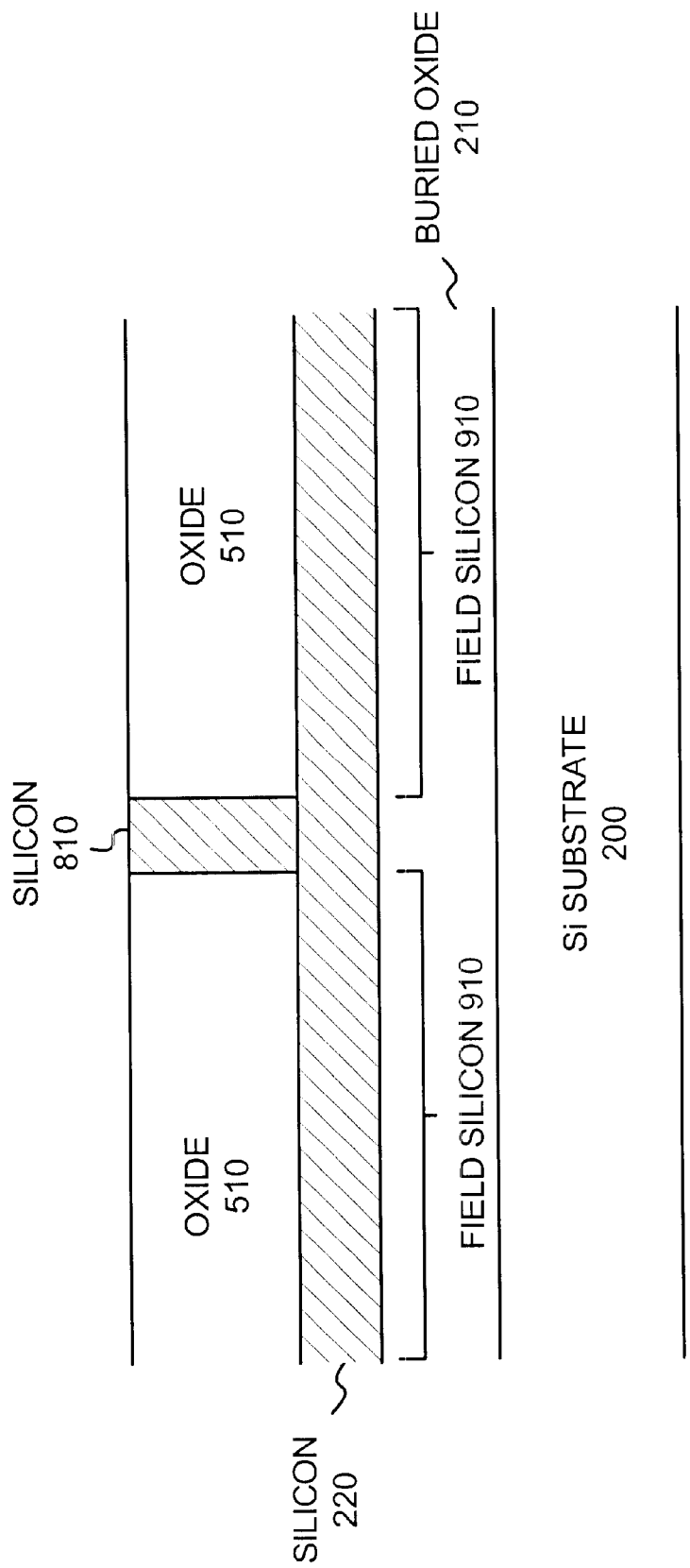

After opening 700 has been formed, silicon 810 may be grown via, for example, selective epitaxy of silicon layer 220, to fill opening 700, as illustrated in FIG. 8 (act 140). A chemical-mechanical polish (CMP) or other similar technique may be performed, if necessary, to planarize the upper surface of the semiconductor device and to remove any silicon 810 that grows above the top surface of oxide layer 510, as illustrated in FIG. 9 (act 145). As illustrated in FIG. 9, the portion of silicon layer 220 below the remaining portions of oxide layer 510 are denoted as field silicon 910.

Figure 10:
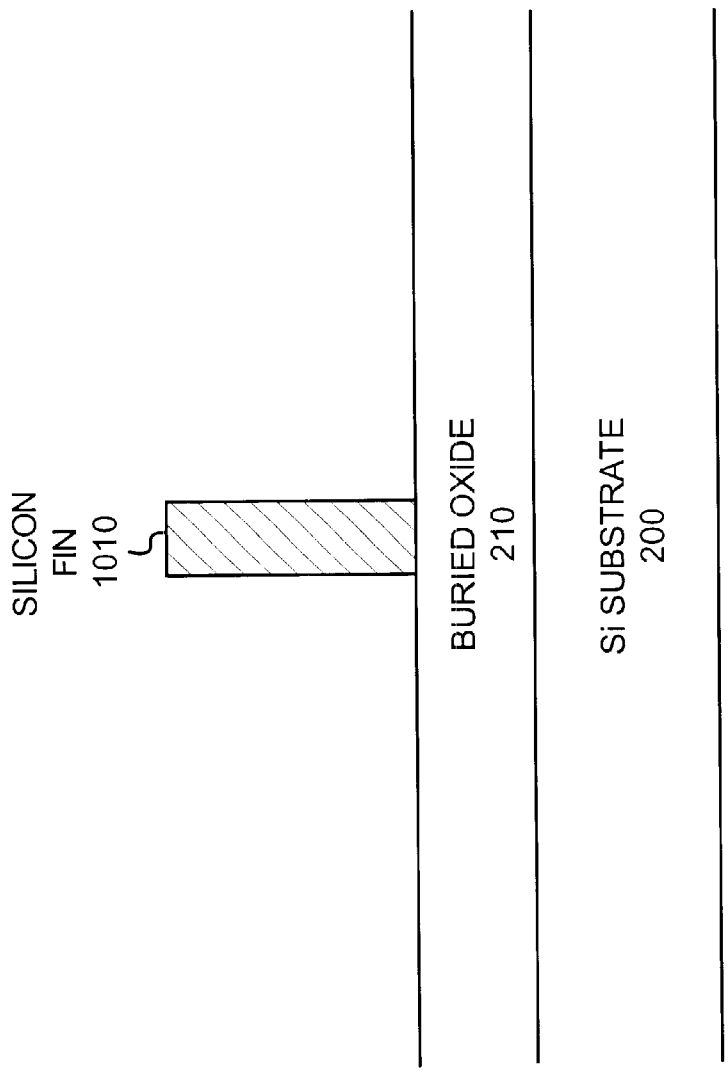

Next, a fin 1010 may be formed by removing oxide layer 510 and field silicon 910, as illustrated in FIG. 10 (act 150).

The remaining oxide layer 510 may be removed, for example, by etching or some other conventional technique. Field silicon 910 may be removed via, for example, a highly anisotropic dry etch. In accordance with an implementation of the invention, the width of fin 1010 may range from about 250 Å to 450 Å. The height of fin 1010 may range from about 100 Å to 1000 Å. However, as discussed above, it should be understood that the particular width and height of fin 1010 may vary based on the particular circuit requirements associated with the fin and FinFET device that will be formed.

Figure 11:
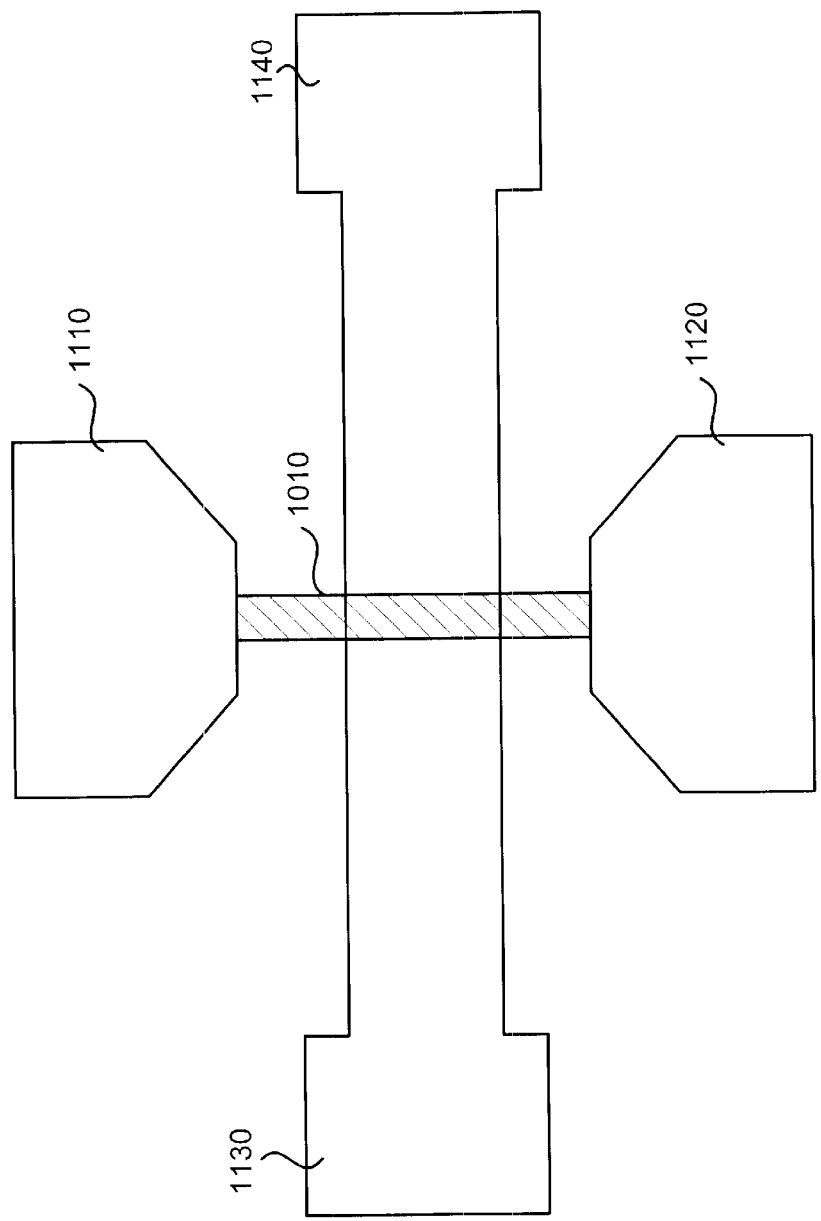
FIG. 11 illustrates an exemplary top view of a FinFET device fabricated according to the processing described in FIG. 1.

After fin 1010 is formed, conventional fabrication processing can be performed to complete the transistor. For example, a gate dielectric may be formed on the side surfaces of fin 1010. Source/drain regions may then be formed at the respective ends of fin 1010, followed by formation of one or more gates. For example, a silicon layer, germanium layer, combinations of silicon and germanium or various metals may be used as the gate material. The gate material may then be patterned and etched to form the gate electrodes. For example, FIG. 11 illustrates a top view of a semiconductor device consistent with the principles of the invention after the source/drain regions and gate electrodes are formed. As illustrated, the semiconductor device may include a double gate structure with fin 1010, source drain regions 1110 and 1120, and gate electrodes 1130 and 1140.

The source/drain regions 1110 and 1120 may then be doped with n-type or p-type impurities based on the particular end device requirements. In addition, sidewall spacers may optionally be formed prior to the source/drain ion implantation to control the location of the source/drain junctions based on the particular circuit requirements. Activation annealing may then be performed to activate the source/drain regions 1110 and 1120.

While the above-described processing focused on the formation of a single fin, implementations consistent with the present invention are not so limited. In fact, the methodology of the present invention may be used to form any number of fins, based on the particular circuit requirements. For example, if more than one fin is to be formed, multiple amorphous carbon structures and subsequent openings may be formed (FIGS. 4 and 7). The processing for forming the fins may then proceed as described above with respect to acts 140 to 150.

Thus, in accordance with the present invention, a FinFET device may be formed with a narrow fin.

CONCLUSION

Implementations consistent with the principles of the invention form a fin in FinFET devices. A narrow fin may be formed through the use of a sacrificial amorphous carbon layer.

The foregoing description of exemplary embodiments of the present invention provides illustration and description, but is not intended to be exhaustive or to limit the invention to the precise form disclosed. Modifications and variations are possible in light of the above teachings or may be acquired from practice of the invention. For example, in the above descriptions, numerous specific details are set forth, such as specific materials, structures, chemicals, processes, etc., in order to provide a thorough understanding of the present invention. However, the present invention can be practiced without resorting to the details specifically set forth herein. In other instances, well known processing structures have not been described in detail, in order not to unnecessarily obscure the thrust of the present invention. In practicing the present invention, conventional deposition, photolithographic and etching techniques may be employed, and hence, the details of such techniques have not been set forth herein in detail.

While a series of acts has been described with regard to FIG. 1, the order of the acts may be varied in other implementations consistent with the present invention. Moreover, non-dependent acts may be implemented in parallel.

No element, act, or instruction used in the description of the present application should be construed as critical or essential to the invention unless explicitly described as such. Also, as used herein, the article "a" is intended to include one or more items. Where only one item is intended, the term "one" or similar language is used.

The scope of the invention is defined by the claims and their equivalents.

What is claimed is:

1. A method for forming a fin in a FinFET, comprising:
   forming a carbon layer on a silicon on insulator (SOI) wafer;
   forming a mask on the carbon layer;
   etching the mask and the carbon layer to a first width;
   etching the carbon layer to a second width;
   forming an oxide layer over the mask and carbon layer;
   removing a portion of the oxide layer and the mask;
   removing the carbon layer to create an opening in a remaining portion of the oxide layer;
   forming silicon in the opening; and
   removing the remaining portion of the oxide layer and silicon located under the remaining portion of the oxide layer to form a fin.

2. The method of claim 1 wherein the forming a carbon layer includes:
   forming an amorphous carbon layer to a thickness ranging from about 500 Å to about 1500 Å.

3. The method of claim 1 wherein the mask includes at least one of an oxide and a nitride.

4. The method of claim 1 wherein the first width ranges from about 500 Å to about 1000 Å.

5. The method of claim 1 wherein the second width ranges from about 250 Å to 450 Å.

6. The method of claim 1 wherein the etching the mask and the carbon layer to a first width includes:
   forming a second mask over the mask, and
   performing an anisotropic etch to remove a portion of the mask and carbon layer not covered by the second mask.

7. The method of claim 1 wherein the removing the carbon layer includes:
   performing a plasma oxidation to remove the carbon layer.

8. The method of claim 1 wherein the forming silicon in the opening includes:
   growing the silicon from the SOI wafer to fill the opening.

9. The method of claim 1 wherein a width of the fin is substantially equal to the second width.

10. A method of manufacturing a semiconductor device that includes a substrate, an insulating layer formed on the substrate, and a conductive layer formed on the insulating layer, comprising:
    depositing an amorphous carbon layer over the conductive layer;
    forming a hard mask over the amorphous carbon layer;
    etching the hard mask and the amorphous carbon layer to a first width;
    etching the amorphous carbon layer to a second width;
    depositing an oxide layer to surround the hard mask and amorphous carbon layer;
    removing a portion of the oxide layer and the hard mask;
    removing the amorphous carbon layer to form an opening in a remaining portion of the oxide layer;
    filling the opening with conductive material;
    removing the remaining portion of the oxide layer and a portion of the conductive layer to form a fin structure;
    forming a source region and a drain region;
    depositing a gate material over the fin structure; and
    patterning and etching the gate material to form at least one gate electrode.

11. The method of claim 10 wherein the conductive material comprises silicon.

12. The method of claim 10 wherein the depositing an amorphous carbon layer includes:
    depositing the amorphous carbon layer to a thickness ranging from about 500 Å to 1500 Å.

13. The method of claim 10 wherein the filling includes:
    growing the conductive layer to fill the opening.

14. The method of claim 10 wherein the second width is approximately about 250 Å to 450 Å.

15. The method of claim 10 wherein a width of the fin structure is approximately equal to the second width.

16. The method of claim 10 wherein the etching the amorphous carbon layer includes:
    performing a trim etch to reduce the amorphous carbon layer from the first width to the second width.

17. A method for forming at least one fin in a semiconductor device that includes a substrate, an insulating layer formed on the substrate, and a conductive layer formed on the insulating layer, the method comprising:
    forming a carbon layer over the conductive layer;
    forming a mask over the carbon layer;
    etching the mask and carbon layer to form at least one structure, the structure having a first width;
    reducing the width of the carbon layer in the at least one structure to a second width;
    depositing an oxide layer to surround the at least one structure;
    removing a portion of the oxide layer and the mask;
    removing the carbon layer to form an opening in a remaining portion of the oxide layer for each of the at least one structure;
    filling the opening with conductive material; and
    removing the remaining portion of the oxide layer and a portion of the conductive layer to form the at least one fin.

18. The method of claim 17 wherein a width of each of the at least one fin is approximately about 250 Å to 450 Å.

19. The method of claim 17 wherein a height of each of the at least one fin is approximately about 100 Å to 1000 Å.

20. The method of claim 17 wherein the conductive material comprises silicon.

* * * * *